United States Patent [19]
Wong

[11] Patent Number: 5,432,486
[45] Date of Patent: Jul. 11, 1995

[54] CAPACITIVE AND INDUCTIVE COUPLING CONNECTOR

[75] Inventor: Larry K.-C. Wong, Kanata, Canada

[73] Assignee: Northern Telecom Limited, Montreal, Canada

[21] Appl. No.: 64,284

[22] Filed: May 20, 1993

[51] Int. Cl.⁶ .............................. H01P 5/18
[52] U.S. Cl. .................. 333/109; 333/24 R; 333/260; 361/789; 439/67
[58] Field of Search ............ 333/109, 116, 260, 24 R, 333/24 C; 439/67, 77; 361/749, 750, 789

[56] References Cited

U.S. PATENT DOCUMENTS

| | | | |
|---|---|---|---|
| 3,629,787 | 12/1971 | Wilson | 361/749 X |
| 4,045,750 | 8/1977 | Marshall | 333/100 |
| 5,018,005 | 5/1991 | Lin et al. | 361/749 X |
| 5,076,817 | 1/1994 | Matschke et al. | 439/67 X |
| 5,297,968 | 3/1994 | Johnson et al. | 439/67 |
| 5,763,835 | 11/1992 | Morrion et al. | 439/67 |

*Primary Examiner*—Paul Gensler
*Attorney, Agent, or Firm*—Dallas F. Smith; Yoshiharu Toyooka

[57] ABSTRACT

A coupling connector relies on inductive and capacitive coupling over a length $L_c$ to "connect" signals from a first circuit card to a second circuit card. The coupling connector includes a flex circuit which in a connected state is compressed to provide a coupling length $L_c$ between the first and second circuit cards. A typical application is for coupling cards to a backplane having a plurality of parallel, signal carrying tracks. The near end of each coupling track is input to a receiver having an input impedance equal to the characteristic impedance of the coupling track. The far end of the coupling track is terminated by a resistor whose value equals the characteristic impedance of the coupling track.

10 Claims, 2 Drawing Sheets

CAPACITIVE AND INDUCTIVE COUPLING CONNECTOR

This invention relates to coupling connectors.

BACKGROUND TO THE INVENTION

Advances in microprocessor technology continue to push operating speeds higher. These higher speeds both allow and mandate correspondingly higher transmission rates. As transmission rates increase toward the gigabit per second rate, several well-known phenomena become problematic. One is the generation of electromagnetic interference (EMI) at physical interfaces, for example connectors. This problem is of increasing concern as regulatory agencies draft and impose rules limiting the level of allowable emission. In typical equipment shelves with multiple plug-in circuit boards edge-connected to a backplane, limiting emissions from connectors is nontrivial. In multi-drop bussing schemes impedance mismatching may further exacerbate the EMI problem.

SUMMARY OF THE INVENTION

An object of the present invention is to provide an improved coupling connector.

In accordance with the present invention there is provided a coupling connector for coupling to a second circuit having at least one conductive track disposed thereon comprising: a flex circuit having at least one conductive track disposed thereon; means for attaching the flex circuit to a circuit board; and means for registering the conductive track of the flex circuit and the conductive track of the second circuit and for maintaining the conductive track of the flex circuit proximate to the conductive track of the second circuit for a predetermined length.

In accordance with another aspect of the present invention there is provided a coupling connector for coupling to a second circuit having at least one conductive track comprising: a circuit board; a flex circuit having at least one conductive track disposed thereon and attached to the circuit board; a receiver disposed on the circuit board and connected to one end of the conductive track; a termination resistor disposed on the circuit board and connected to the other end of the conductive track; and means for registering the conductive track of the flex circuit with the conductive track of the second circuit and for maintaining the conductive track of the flex circuit proximate to the conductive track of the second circuit for a predetermined length.

In accordance with another aspect of the present invention there is provided a backplane assembly comprising: a backplane printed circuit board having a plurality of substantially parallel conductive tracks; and a coupling connector for coupling to a second circuit having at least one conductive track comprising: a circuit board; a flex circuit having at least one conductive track disposed thereon and attached to the circuit board; a receiver disposed on the circuit board and connected to one end of the conductive track; a termination resistor disposed on the circuit board and connected to the other end of the conductive track; and means for registering the conductive track of the flex circuit with the conductive track of the second circuit and for maintaining the conductive track of the flex circuit proximate to the conductive track of the second circuit for a predetermined length.

In accordance with another aspect of the present invention there is provided a coupling connector for coupling to a second circuit having at least one conductive track comprising: two circuit boards; a flex circuit having at least one conductive track disposed thereon and having each of its ends attached to a respective circuit board; a receiver disposed on one circuit board and connected to one end of the conductive track; a termination resistor disposed on the other circuit board and connected to the other end of the conductive track; and means for registering the conductive track of the flex circuit with the conductive track of the second circuit and for maintaining the conductive track of the flex circuit proximate to the conductive track of the second circuit for a predetermined length.

Advantages of a connector in accordance with the present invention are a capability of receiving data at speeds between 1 bit/s and 2.5 Gbit/s, a significantly lower force is required to engage the connector than with pin-type connectors, elimination of pin connector problems, elimination of holes for connector that may block signal tracks, a lower level of radiated emission at the connector, and a degree of insensitivity to distortion in the main driving signal.

BRIEF DESCRIPTION OF THE DRAWINGS

The present invention will be further understood from the following description with reference to the drawings in which.

Similar references are used in different figures to denote similar components.

DETAILED DESCRIPTION

Figure 1:
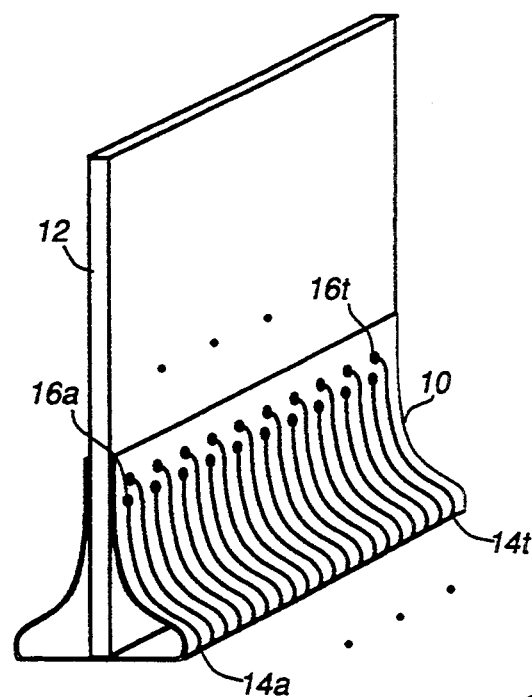
FIG. 1 illustrates, in an isometric view, an inductive coupling connector in accordance with one embodiment of the present invention.

Referring to FIG. 1, there is illustrated a coupling connector in accordance with one embodiment of the present invention. The coupling connector includes a flex circuit 10 for attachment to a printed circuit board 12. The flex circuit 10 includes a plurality of substantially parallel conductive tracks 14a through 14t. Tracks 14a through 14t are ended with pads 16a through 16t at each end thereof which on assembly lie on each side of the printed circuit board 12 (pads on the back of board not shown in FIG. 1).

Figure 2:
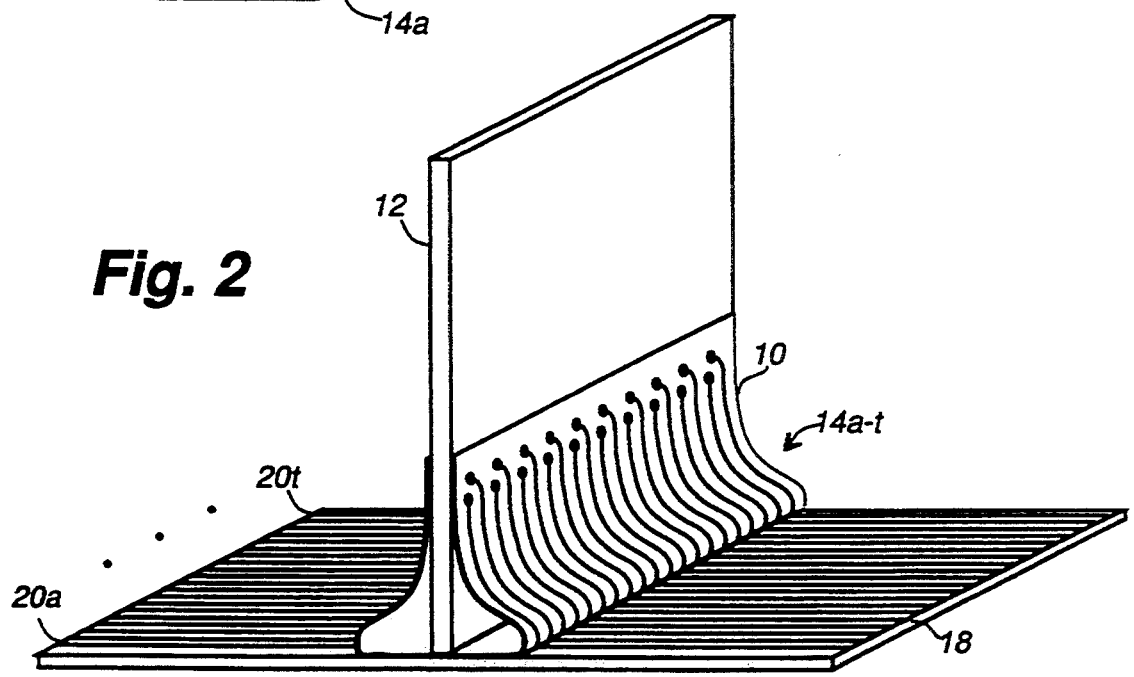
FIG. 2 illustrates, in an isometric view, an arrangement including the coupling connector of FIG. 1 and a backplane in accordance with an embodiment of the present invention.

In FIG. 2, the coupling connector of FIG. 1 is illustrated in registered contact with a backplane printed circuit board (PCB) 18. The backplane PCB 18 includes a plurality of substantially parallel conductive tracks 20a through 20t. Tracks 14 of flex circuit 10 are coated with an electrically insulating layer that prevents direct electrical contact with tracks 20 of backplane PCB 18.

Spacing of tracks 14 and tracks 20 is similar such that registered contact between the inductive coupling connector and the PCB backplane 18 causes a coupling length $L_c$ of tracks 14 to overlay corresponding tracks 20.

Figure 3:
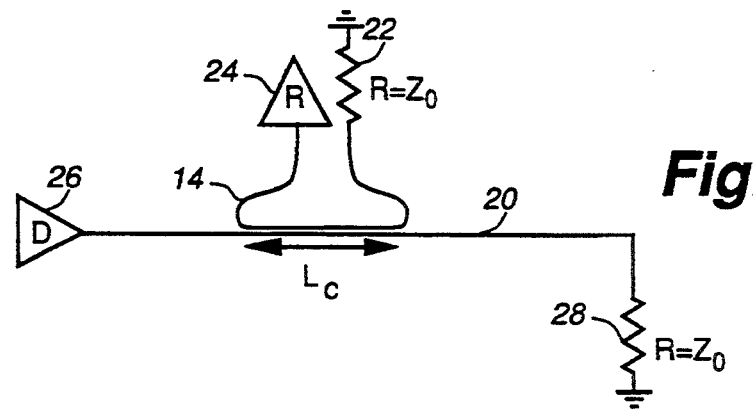
FIG. 3 schematically illustrates the arrangement of FIG. 2.

Referring to FIG. 3, there is schematically illustrated single tracks of the arrangement of FIG. 2. The track 14 of flex circuit 10 is terminated at a far end by a resistor 22 and at a near end by a receiver 24 whose input impedance is equal to that of resistor 22. The resistor 22 has a value $R=Z_0$, where $Z_0$ is the characteristic impedance of the track. The track 20 of the backplane PCB 18 has a driver 26 connected to its input and is terminated by a resistor 28 whose value is $R=Z_0$, where $Z_0$ is the characteristic impedance of the track.

Figure 4:
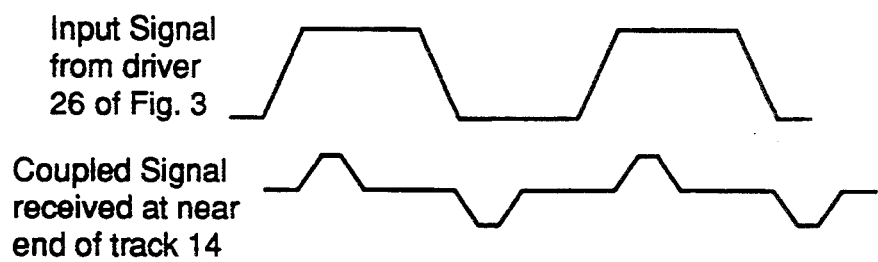
FIG. 4 graphically illustrates waveforms representative of signals typical of the connector and the backplane of FIG. 2.

In FIG. 4, a typical NRZ signal on the backplane track 20 is graphically represented by input signal and a typical coupled signal at the near end of connector track 14 is graphically represented by coupled signal.

In operation, a trapezoidal NRZ signal is driven onto the track 20 of backplane PCB 18 by the driver 26. The signal is inductively and capacitively coupled to the track 14. Because of the terminations of the track 20 by the resistor 28 and of the track 14 at both ends by resistances equal to the respective characteristic impedance of the track, the near end signal, applied to the receiver 24, has a bipolar shape as represented by the coupled signal. The shape of the peaks of the coupled signal are dependent upon the coupling length $L_c$ and the characteristics of the input signal, that is the voltage, $V_0$, the rise time, $t_r$, and the fall time $t_f$.

Figure 5:
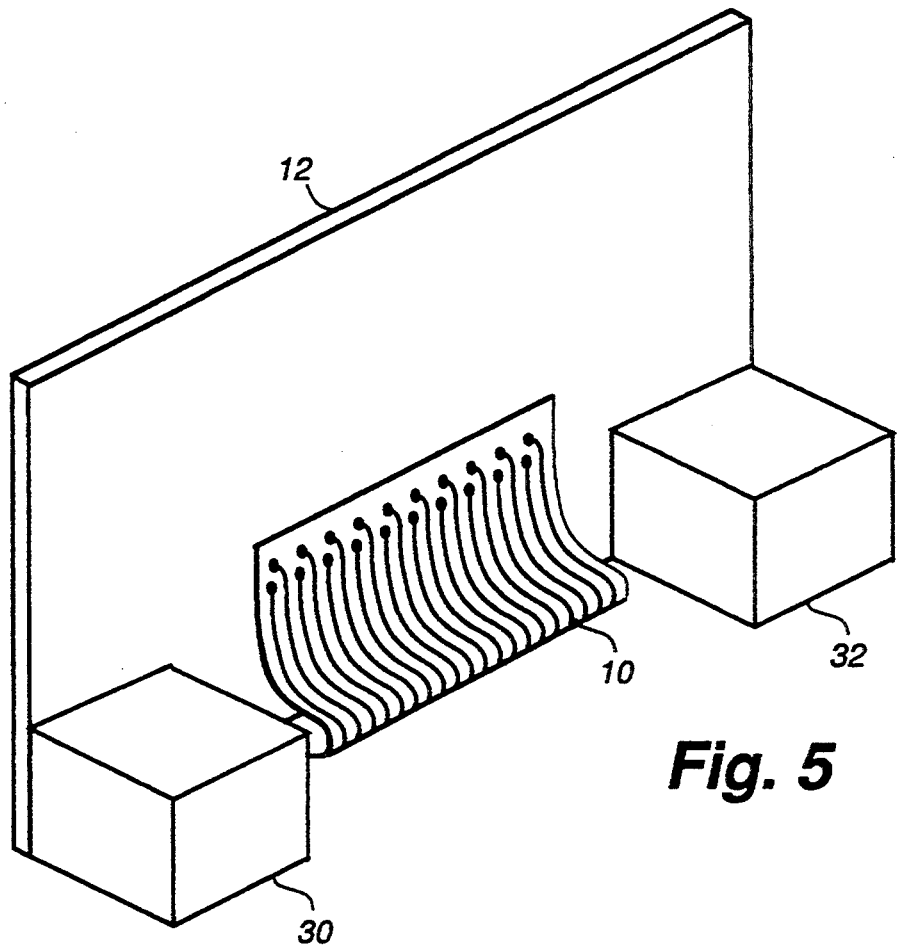
FIG. 5 illustrates, in an isometric view, a coupling connector in accordance with a particular embodiment of the present invention.

Referring to FIG. 5, there is illustrated, in an isometric view, a coupling connector in accordance with another embodiment of the present invention. As in FIG. 1, the coupling connector includes a flex circuit 10 for attachment to a printed circuit board 12. The coupling connector also includes pin box connectors 30 and 32 mounted on the circuit board 12. Pin box connectors 30 and 32 can provide power and other connections to the circuit board 12 and registration of the flex circuit 10 with respect to a backplane (not shown in FIG. 5). While many other alignment devices may be used, the box pin connectors are convenient in that they provide sufficient mechanical alignment for ensuring coupling of the inductive coupling connector to the backplane while they provide power and other connections.

Figure 6:
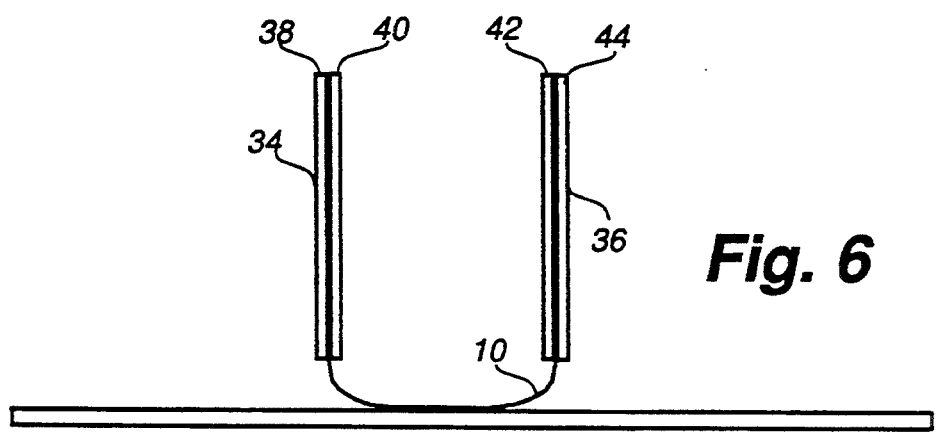
FIG. 6 illustrates, in a cross-sectional view, a coupling connector in accordance with a further embodiment of the present invention.

Referring to FIG. 6, there is illustrated, in a cross-sectional view, a coupling connector in accordance with a further embodiment of the present invention. The coupling connector includes the flex circuit 10, as in FIG. 1, and two daughter boards 34 and 36 each sandwiched onto a respective end of flex circuit 10. Each daughter board 34 and 36 includes two printed circuit boards 38 and 40 and 42 and 44, respectively, that are sandwiched onto the flex circuit 10. The daughter boards 34 and 36 can be connected to larger printed circuit boards by known methods. This arrangement allows two printed circuit boards to be interconnected via the flex circuit that forms part of the flexible coupling. In this embodiment the receiver 24 (FIG. 3) is disposed on one circuit board and connected to one end of the conductive track and the termination resistor 22 (FIG. 3) is disposed on the other circuit board and connected to the other end of the conductive track. Problems associated with attaching the flex circuit directly to the circuit boards are eliminated.

Due to the possibility of EMI emissions from the exposed tracks of the flex circuit, appropriate covering of these tracks is used in particular embodiments concerned with limiting such emissions. However, for ease of illustrating the embodiments of the present invention, such coverings are not shown in FIGS. 1, 2, 5, and 6.

Numerous modifications, variations and adaptations may be made to the particular embodiments of the invention described above without departing from the scope of the invention, which is defined in the claims.

What is claimed is:

1. A coupling connector for coupling a first circuit to a second circuit having at least one conductive track disposed thereon comprising:
   a circuit board for providing the first circuit;
   a flex circuit having at least one conductive track disposed thereon and an electrically insulating layer coating the conductive track and attached to the circuit board;
   a receiver of the first circuit disposed on the circuit board and connected to one end of the conductive track;
   a termination resistor disposed on the circuit board and connected to the other end of the conductive track; and
   means for registering the conductive track of the flex circuit with the conductive track of the second circuit and for maintaining the conductive track of the flex circuit proximate to the conductive track of the second circuit for a predetermined length; said electrically insulating later preventing direct electrical contact between the conductive tracks.

2. A coupling connector as claimed in claim 1 wherein the means for registering and maintaining includes a pin box connector mounted on the circuit board.

3. A coupling connector as claimed in claim 2 wherein the means for registering and maintaining includes two pin box connectors mounted on the circuit board with the flex circuit therebetween.

4. A backplane assembly comprising:
   a backplane printed circuit board having a plurality of substantially parallel conductive tracks; and
   a coupling connector for coupling a first circuit via the backplane to a second circuit and having at least one conductive track comprising:
   a circuit board for providing the first circuit;
   a flex circuit having at least one conductive track disposed thereon and an electrically insulated layer coating the conductive track and attached to the circuit board;
   a receiver of the first circuit disposed on the circuit board and connected to one end of the conductive track;
   a termination resistor disposed on the circuit board and connected to the other end of the conductive track; and
   means for registering the conductive track of the flex circuit with the conductive track of the second circuit and for maintaining the conductive track of the flex circuit proximate to the conductive track of the second circuit for a predetermined length; said electrically insulating layer preventing direct electrical contact between the conductive tracks.

5. A backplane assembly as claimed in claim 4 wherein the means for registering and maintaining includes a pin box connector mounted on the circuit board.

6. A backplane assembly as claimed in claim 5 wherein the means for registering and maintaining includes two pin box connectors mounted on the circuit board with the flex circuit therebetween.

7. A backplane assembly as claimed in claim 4 wherein each of the plurality of substantially parallel conductive tracks is driven at first ends by a driver and terminated at second ends by a termination resistor, the first ends being adjacent to the end of the conductive track of the flex circuit to which the receiver is connected.

8. A backplane assembly as claimed in claim 4 wherein the flex circuit includes a plurality of conductive tracks.

9. A coupling connector for coupling a first circuit to a second circuit having at least one conductive track comprising:

two circuit boards;

a flex circuit having at least one conductive track disposed thereon and an electrically insulating layer coating the conductive track and having each of its ends attached to a respective circuit board;

a receiver of the first circuit disposed on one circuit board and connected to one end of the conductive track;

a termination resistor disposed on the other circuit board and connected to the other end of the conductive track; and means for registering the conductive track of the flex circuit with the conductive track of the second circuit and for maintaining the conductive track of the flex circuit proximate to the conductive track of the second circuit for a predetermined length; said electrically insulating layer preventing direct electrical contact between the conductive tracks.

10. A coupling connector as claimed in claim 9 wherein each of the two circuit boards comprises two printed circuits and the flex circuit is attached thereto by sandwiching it between the two printed circuits.

* * * * *